(12) United States Patent
Itoh

(10) Patent No.: US 6,710,915 B2
(45) Date of Patent: Mar. 23, 2004

(54) LIGHT AMPLIFIER DEVICE AND OPTICAL PICKUP DEVICE EMPLOYING IT

(75) Inventor: Hiroaki Itoh, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 75 days.

(21) Appl. No.: 10/191,515

(22) Filed: Jul. 10, 2002

(65) Prior Publication Data

US 2003/0011873 A1 Jan. 16, 2003

(30) Foreign Application Priority Data

Jul. 10, 2001 (JP) ........................................ 2001-209450

(51) Int. Cl.[7] .............................. H01S 3/00; H01J 40/14
(52) U.S. Cl. .................................. 359/333; 250/214 A
(58) Field of Search ....................... 359/333; 250/214 A

(56) References Cited

U.S. PATENT DOCUMENTS 5,311,353 A * 5/1994 Crawford .................. 359/333
5,455,705 A * 10/1995 Gusinov ..................... 359/189
6,342,694 B1 * 1/2002 Satoh ...................... 250/214 A

FOREIGN PATENT DOCUMENTS

| EP | 0892511 A2 | * 1/1999 |
| JP | 2-301879 | 12/1990 |
| WO | WO 90/12452 | * 10/1990 |

* cited by examiner

*Primary Examiner*—Mark Hellner
(74) *Attorney, Agent, or Firm*—Birch, Stewart, Kolasch & Birch, LLP

(57) ABSTRACT

In a conventional light amplifier, when an addition or subtraction operation is performed on currents output from a plurality of light-receiving elements to output a voltage amplified according to the current resulting from the addition or subtraction operation, increasing the gain results in reducing the loop gain, making it impossible to achieve a wide band width. A light amplifier of the invention is provided with a plurality of light amplifier circuits, each having a light-receiving element that outputs a current according to the intensity of light received and a current amplifier that outputs a current by amplifying the output current of the light-receiving element, and a first transimpedance amplifier whose input terminal is connected to the node at which the output terminals of the individual current amplifiers are connected together. This helps prevent the lowering of the loop gain when the gain is increased.

16 Claims, 3 Drawing Sheets

LIGHT AMPLIFIER DEVICE AND OPTICAL PICKUP DEVICE EMPLOYING IT

BACKGROUND OF THE INVENTION

1. Field of the Invention

The present invention relates to a light amplifier device that performs an addition or subtraction operation on currents output from a plurality of light-receiving elements and that outputs a voltage amplified according to the current resulting from the addition or subtraction operation. More particularly, the present invention relates to a light amplifier device for use in an optical pickup device.

2. Description of the Prior Art

In an optical pickup device for optical discs, a current signal output from a light-receiving section is used not only for data reading but also for servo control to achieve focusing (focusing of a reading light beam) and tracking (positioning of the reading light beam), both essential for correct reading of data. To achieve this, the light-receiving section is usually provided with not a single light-receiving element but a plurality of light-receiving elements arranged next to one another so that the servo control is achieved on the basis of the differences in the amount of light received by the individual light-receiving elements when a spot of light is incident on the light-receiving section.

On the other hand, for the purpose of data reading, to minimize read errors, a signal obtained by adding together all the current signals output from the individual light-receiving elements is used. Formerly, this addition operation has been performed by a signal processing integrated circuit provided outside an optical pickup device. Recently, however, such an addition operation has come to be performed increasingly by a light amplifier provided within an optical pickup device. One reason is that read and write rates have recently been increasing dramatically. Another reason is that, for reproduction from a plurality of types of optical discs, a laser beam having a plurality of frequencies has come to be used, which lowers the S/N ratio of the output signals from the light-receiving elements and accordingly makes less negligible the noise induced in the leads connecting the light-receiving elements to the signal processing integrated circuit that processes the output signals of the light-receiving elements. Still another reason is that further reduction of costs and electric power consumption has been expected in optical pickup devices.

FIG. 6 shows the configuration of a conventional light amplifier that adds together the current signals output from a plurality of light-receiving elements. The cathode of a photodiode D1 is connected to the input terminal of a transimpedance amplifier 26, and the cathode of a photodiode D2 is connected to the input terminal of a transimpedance amplifier 27. The anodes of the photodiodes D1 and D2 are kept at the ground potential. It is to be noted that a transimpedance amplifier denotes an amplifier that converts a current signal it receives into a voltage signal it outputs.

The output terminal of the transimpedance amplifier 26 is connected to one end of a resistor R6, and the output terminal of the transimpedance amplifier 27 is connected to one end of a resistor R7. The other ends of the resistors R6 and R7 are connected together, and the node n2 between them is connected to the input side of a non-inverting amplifier 28. The output side of the non-inverting amplifier 28 is connected to a terminal 4.

The non-inverting amplifier 28 is composed of an operational amplifier OP2 and resistors R8 and R9. The non-inverting input terminal of the operational amplifier OP2 serves as the input side of the non-inverting amplifier 28. One end of the resistor R8 and one end of the resistor R9 are connected to the inverting input terminal of the operational amplifier OP2, and the other end of the resistor R9 is kept at the ground potential. The other end of the resistor R8 is connected to the output terminal of the operational amplifier OP2, and the node between them serves as the output side of the non-inverting amplifier 28.

The output voltage $V_O'$ of the light amplifier configured as described above is given as follows. Let the output voltage of the transimpedance amplifier 26 be $V_{26}$, the output voltage of the transimpedance amplifier 27 be $V_{27}$, and the potential at the node n2 be $V_{n2}$. Then, the current I fed to the non-inverting input terminal of the operational amplifier OP2 is given by equation (1) below, where $r_6$ represents the resistance of the resistor R6 and $r_7$ represents the resistance of the resistor R7.

$$I=(V_{26}-V_{n2})/r_6+(V_{27}-V_{n2})/r_7 \tag{1}$$

The relationship between the voltage $V_{n2}$ and the output voltage $V_O'$ is expressed by equation (2) below, where $r_8$ represents the resistance of the resistor R8 and $r_9$ represents resistance of the resistor R9.

$$V_O'=(1+r_8/r_9) \times V_{n2} \tag{2}$$

When equations (1) and (2) are integrated together, the output voltage $V_O'$ is given by equation (3) below. Here, the term including the current I, which is a very small current, is approximated as zero.

$$V_O'=(1+r_8/r_9) \times (r_7 \times V_{26}+r_6 \times V_{27})/(r_6+r_7) \tag{3}$$

When the resistance $r_9$ of the resistor R9 is set as defined by equation (4) below, and equations (3) and (4) are integrated together, then the output voltage $V_O'$ is given by equation (5) below.

$$r_9=(r_6 \times r_7)/(r_6+r_7) \tag{4}$$

$$V_O'=(1+r_8/r_9) \times r_9 \times (V_{26}/r_6+V_{27}/r_7) \tag{5}$$

In equation (5), $V_{26}/r_6$ can be regarded as the output current of the transimpedance amplifier 26, and $V_{27}/r_7$ can be regarded as the output current of the transimpedance amplifier 27. Moreover, the voltage $V_{26}$ is the result of the conversion of the output current of the photodiode D1 by the transimpedance amplifier 26, and the voltage $V_{27}$ is the result of the conversion of the output current of the photodiode D2 by the transimpedance amplifier 27. Hence, equation (5) shows that the output voltage $V_O'$ is a voltage amplified according to the value obtained by adding together the currents output from the photodiodes D1 and D2.

In the conventional light amplifier shown in FIG. 6, if the gain of the operational amplifier OP2 is assumed to be $A_0$, the loop gain T' of the non-inverting amplifier 28, which is a negative feedback amplifier, is given by equation (6) below.

$$T'=A_0 \times r_9/(r_9+r_8) \tag{6}$$

Here, an attempt to increase the gain of the conventional light amplifier shown in FIG. 6 by increasing the amplification factor of the current signals fed to the transimpedance amplifiers 26 and 27 results, since the resistance $r_9$ is set as defined by equation (4), in reducing the resistance $r_9$, with the result that, as equation (6) clearly shows, the loop gain T' of the non-inverting amplifier 28 is reduced.

In the conventional light amplifier shown in FIG. 6, its characteristics are enhanced by a factor of [(loop gain)/(gain after negative feedback)] by configuring the non-inverting amplifier 28 as a negative feedback amplifier, as compared with a case where no negative feedback is present. However, as described above, when the amplification factor of the current signals fed to the transimpedance amplifiers 26 and 27 is increased with a view to increasing the gain of the conventional light amplifier shown in FIG. 6, the loop gain T' of the non-inverting amplifier 28 is reduced, and thus the characteristics of the non-inverting amplifier 28 are degraded. This makes it impossible to achieve a high gain and a wide band width with the conventional light amplifier shown in FIG. 6.

Incidentally, Japanese Patent Application Laid-Open No. H2-301879 discloses an adder that outputs a voltage amplified according to the current obtained by adding together the output currents of a plurality of amplifiers (conductance amplifiers or variable conductance amplifiers) provided within the adder itself. However, the amplifiers provided within this adder receive voltages as their inputs, and therefore this adder cannot be used as a light amplifier to which the output currents from light-receiving elements are fed.

SUMMARY OF THE INVENTION

An object of the present invention is to provide a high-gain, wide-band-width light amplifier that performs an addition or subtraction operation on currents output from a plurality of light-receiving elements and that outputs a voltage amplified according to the current resulting from the addition or subtraction, and to provide an optical pickup device employing such a light amplifier.

To achieve the above object, according to the present invention, a light amplifier is provided with: a plurality of light amplifier circuits, each having a light-receiving element that outputs a current according to the intensity of light received and a current amplifier that outputs a current by amplifying the output current of the light-receiving element; and a first transimpedance amplifier whose input terminal is connected to the node at which the output terminals of the individual current amplifiers are connected together.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
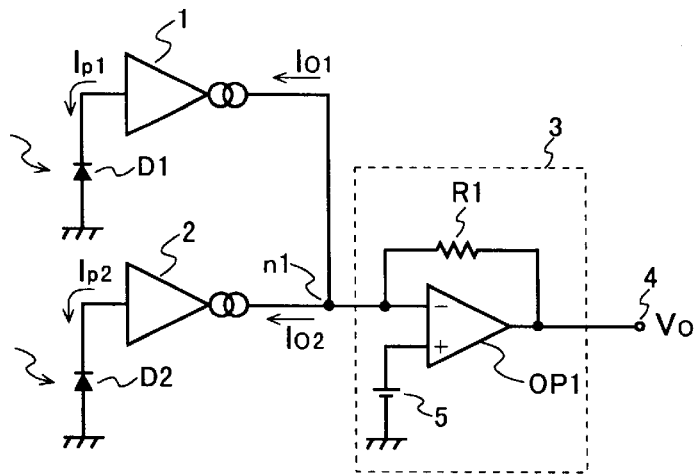
FIG. 1 is a diagram showing the configuration of a light amplifier according to the invention.
Figure 6:
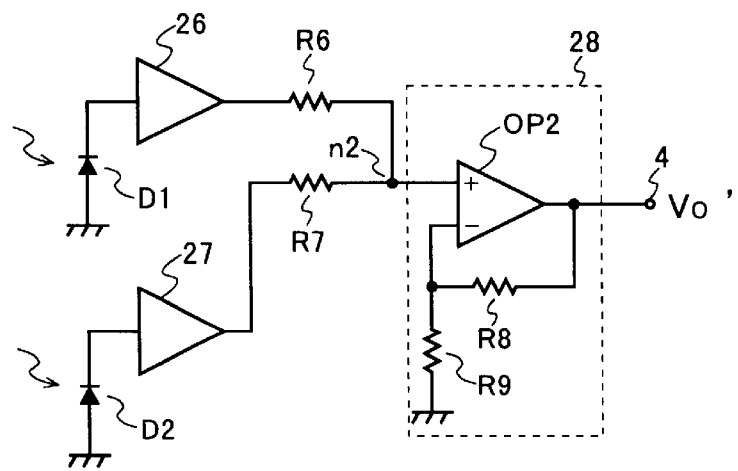
FIG. 6 is a diagram showing the configuration of a conventional light amplifier.

Hereinafter, embodiments of the present invention will be described with reference to the drawings. FIG. 1 shows a light amplifier according to the invention. It is to be noted that such circuit elements and signals as are found also in FIG. 6 are identified with the same reference symbols.

The cathode of a photodiode D1 is connected to the input terminal of a current amplifier 1, and the cathode of a photodiode D2 is connected to the input terminal of a current amplifier 2. The anodes of the photodiodes D1 and D2 are kept at the ground potential.

The output terminals of the current amplifiers 1 and 2 are connected together, and the node n1 between them is connected to the input side of a transimpedance amplifier 3. The output side of the transimpedance amplifier 3 is connected to a terminal 4.

The transimpedance amplifier 3 is composed of an operational amplifier OP1, a resistor R1, and a constant voltage source 5. The inverting input terminal of the operational amplifier OP1 is connected to one end of the resistor R1, and the node between them serves as the input side of the transimpedance amplifier 3. The output terminal of the operational amplifier OP1 is connected to the other end of the resistor R1, and the node between them serves as the output side of the transimpedance amplifier 3. The resistor R1 acts as a negative feedback resistor for the operational amplifier OP1. The positive potential side of the constant voltage source 5 is connected to the non-inverting input terminal of the operational amplifier OP1, and the negative potential side of the constant voltage source 5 is kept at the ground potential.

The circuit configured as described above operates in the following manner. The current amplifier 1 receives the output current of $I_{p1}$ of the photodiode D1, and amplifies it to output a current $I_{O1}$. The current amplifier 2 receives the output current of $I_{p2}$ of the photodiode D2, and amplifies it to output a current $I_{O2}$. Thus, a current that is the sum of the currents $I_{O1}$ and $I_{O2}$ is extracted from the input side of the transimpedance amplifier 3. The operational amplifier OP1 evaluates the difference between the voltages fed to it, and outputs a voltage $V_O$ according to the difference. Thus, equation (7) below holds, where $r_1$ represents the resistance of the resistor R1 and $V_{ref}$ represents the output voltage of the constant voltage source 5.

$$V_O = r_1 \times (I_{O1} + I_{O2}) + V_{ref} \quad (7)$$

Here, if the impedance of the signal source connected to the input side of the transimpedance amplifier 3 is assumed to be $Z_i$, then the loop gain T of the transimpedance amplifier 3 is given by equation (8) below, where the gain of the operational amplifier OP1 is assumed to be $A_0$.

$$T = A_0 \times Z_i / (Z_i + r_1) \quad (8)$$

In the light amplifier of FIG. 1, the impedance $Z_i$ is the reciprocal of the sum of the reciprocals of the output impedances of all the current amplifiers connected to the transimpedance amplifier 3, specifically the current amplifiers 1 and 2. The current amplifiers 1 and 2 both output currents, and therefore have high output impedances. Thus, $Z_i$, which is the reciprocal of the sum of the reciprocals of the output impedances of all the current amplifiers, is far higher than the resistance $r_1$. Accordingly, equation (8) shows that the loop gain T of the transimpedance amplifier 3 is approximately equal to the gain $A_0$.

As described earlier, in a negative feedback amplifier, its characteristics are enhanced by a factor of [(loop gain)/(gain after negative feedback)], as compared with a case where no negative feedback is present. With the light amplifier of FIG.

1, even when its gain is increased by increasing the gain of the current amplifiers 1 and 2, the loop gain T remains equal to the gain $A_0$, and does not lower. This makes it possible to design the light amplifier of FIG. 1 to offer a high gain and a wide band width.

Next, a practical example of the current amplifier provided in the light amplifier of FIG. 1 will be described with reference to FIG. 2. A terminal 9 is connected to the input side of a transimpedance amplifier 6, and the output side of the transimpedance amplifier 6 is connected to the non-inverting input terminal of a transconductance differential amplifier 8. It is to be noted that a transconductance differential amplifier denotes an amplifier that converts the difference between two voltage signals it receives into a current signal it outputs.

The transimpedance amplifier 6 is composed of an amplifier A1 and a resistor R2. The input terminal of the amplifier A1 is connected to one end of the resistor R2, and the node between them serves as the input side of the transimpedance amplifier 6. The output terminal of the amplifier A1 is connected to the other end of the resistor R2, and the node between them serves as the output side of the transimpedance amplifier 6.

The input side of a transimpedance amplifier 7 is connected to a terminal 11, and the output side of the transimpedance amplifier 7 is connected to the inverting input terminal of the transconductance differential amplifier 8. The transimpedance amplifier 7 is composed of an amplifier A2 and a resistor R3. The input terminal of the amplifier A2 is connected to one end of the resistor R3, and the node between them serves as the input side of the transimpedance amplifier 7. The output terminal of the amplifier A2 is connected to the other end of the resistor R3, and the node between them serves as the output side of the transimpedance amplifier 7. The output terminal of the transconductance differential amplifier 8 is connected to a terminal 10.

The terminals 9 and 10 serve as the input and output terminals, respectively, of the current amplifier 1 provided in the light amplifier of FIG. 1. Thus, the transimpedance amplifier 6 receives, via the terminal 9, the output current of $I_{p1}$ of the photodiode D1 and converts it into a voltage to output this voltage signal to the non-inverting input terminal of the transconductance differential amplifier 8. When a bias voltage is applied to the cathode of the photodiode D1, the DC bias level of the output voltage of the transimpedance amplifier 6 varies according to the voltage applied there.

On the other hand, with the terminal 11 kept at the same potential as the bias voltage applied to the cathode of the photodiode D1, the transimpedance amplifier 7 performs current-to-voltage conversion, and outputs the resulting voltage signal to the inverting input terminal of the transconductance differential amplifier 8. Since the transimpedance amplifier 7 outputs a DC bias voltage having the same level as the DC bias level of the output voltage of the transimpedance amplifier 6, the differential operation of the transconductance differential amplifier 8 cancels variations in the DC bias level, which thus no longer exert any effect on the circuit in the succeeding stage. This eliminates the need to consider the matching of the DC bias level, and thus makes it possible to apply the optimum bias voltage to the photodiodes provided in the light amplifier of FIG. 1.

Figure 2:
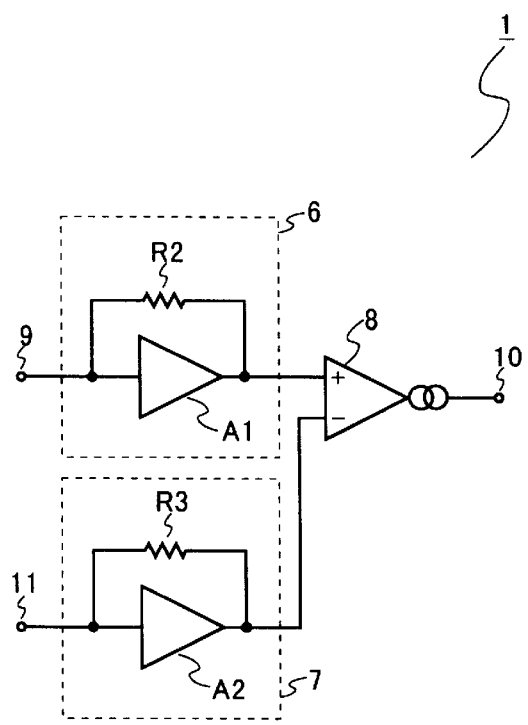
FIG. 2 is a diagram showing the configuration of the current amplifier provided in the light amplifier of FIG. 1.

Of a plurality of current amplifiers provided in a light amplifier according to the invention, those connected to particular light-receiving elements may be configured so as to have not precisely the configuration shown in FIG. 2 but a modified version of it in which the output side of the transimpedance amplifier 6 is connected to the inverting input terminal of the transconductance differential amplifier 8 and the output side of the transimpedance amplifier 7 is connected to the non-inverting input terminal of the transconductance differential amplifier 8. This causes the current amplifiers to output current signals having the opposite polarity in response to the current signals from those particular light-receiving elements, and thus permits those signals to be handled as factors to be subtracted.

Even when the current amplifies connected to particular light-receiving elements are configured in this way, the transimpedance amplifiers 6 and 7 have the same configuration as otherwise, and therefore does not affect the operation of the transconductance differential amplifier 8 in any way. Accordingly, even when other input currents are subjected to an addition or subtraction operation in various combinations, the characteristics of the light amplifier as a whole is little affected thereby. This greatly facilitates the design of the light amplifier in terms of the addition or subtraction operation it performs.

Next, a practical example of the transconductance differential amplifier 8 provided in the current amplifier 1 of FIG. 2 will be described with reference to FIG. 3. The emitters of two PNP-type transistors Q1 and Q2 are connected together, and their node is connected to a terminal 16, to which a constant voltage $V_{CC}$ is supplied. The bases of the PNP-type transistors Q1 and Q2 are also connected together. Moreover, the base and collector of the transistor Q2 are connected together.

The collector of the transistor Q1 is connected to the collector of an NPN-type transistor Q3, and the node between them is connected to an output terminal 14. The collector of the transistor Q2 is connected to the collector of an NPN-type transistor Q4.

The base of the transistor Q3 is connected to a non-inverting input terminal 12, and the base of the transistor Q4 is connected to an inverting input terminal 13. The emitter of the transistor Q3 is connected to one end of a resistor R4, and the emitter of the transistor Q4 is connected to one end of a resistor R5. The other ends of the resistors R4 and R5 are connected together, and the node between them is connected to the positive potential side of a constant current source 15. The negative potential side of the constant current source 15 is kept at the ground potential.

The transconductance differential amplifier 8 configured as described above operates in the following manner. The transistors Q1 and Q2 together form a current mirror circuit, and therefore the collector currents of the transistors Q1 and Q2 are equal. Let this collector current be $I_C$. Then, the emitter current of the transistor Q3 equals $I_C+I_{O1}$, and the emitter current of the transistor Q4 equals $I_C$.

On the other hand, between the emitter current $I_E$ and the base-to-emitter voltage $V_{BE}$ of a transistor, the relationship $V_{BE}=V_T \times \ln(I_E/I_S)$ holds, where $V_T$ represents the thermal voltage of the transistor, ln represents the natural logarithm operator, and $I_S$ represents the saturation current. Moreover, the current that is the sum of the emitter currents of the transistors Q3 and Q4 is equal to the output current $I_{CC}$ of the constant current source 15. Thus, if the resistances $r_4$ and $r_5$ of the resistors R4 and R5 are set equal, equation (9) below holds.

$$V_+ - V_- = r_4 \times I_{O1} + V_{T \times n}[(I_{CC}+I_{O1})/(I_{CC}-I_{O1})] \tag{9}$$

With equation (9), if consideration is given only to operation where $|I_{O1}| \ll I_{CC}$, that is, the output current of the transconductance differential amplifier 8 is far smaller than the drive current of the transconductance differential amplifier 8, then equation (9) above can be rearranged as $$V_+ - V_- = r_4 \times I_{O1} \quad (10)$$

As will be clear from Equation (10), the gain of the transconductance differential amplifier 8 depends on the resistance $r_4$ (=$r_5$). On the other hand, the gain of the transimpedance amplifier 6 provided in the current amplifier 1 of FIG. 2 depends on the resistance $r_2$. Thus, the relationship between the input current $I_{p1}$ and the output current $I_{O1}$ of the current amplifier 1 is expressed as $I_{O1} = r_2/r_4 \times I_{p1}$. By forming the resistors R2, R4, and R5 in the same process, even if there are variations in the individual resistances, it is possible to keep the value of $r_2/r_4$ constant, and thereby keep the gain of the current amplifier 1 constant. By forming also the resistor R3 in the same process as the resistors R2, R4, and R5, even if there are variations in the individual resistances, it is possible to cancel the DC bias level.

It is to be noted that, when the aforementioned presupposition $|I_{O1}| << I_{CC}$ does not hold, that is, in operation where the output current of the transconductance differential amplifier 8 is not negligible relative to the drive current of the transconductance differential amplifier 8, the transconductance differential amplifier 8 loses linearity, and therefore the gain of the current amplifier does not remain constant.

Figure 3:
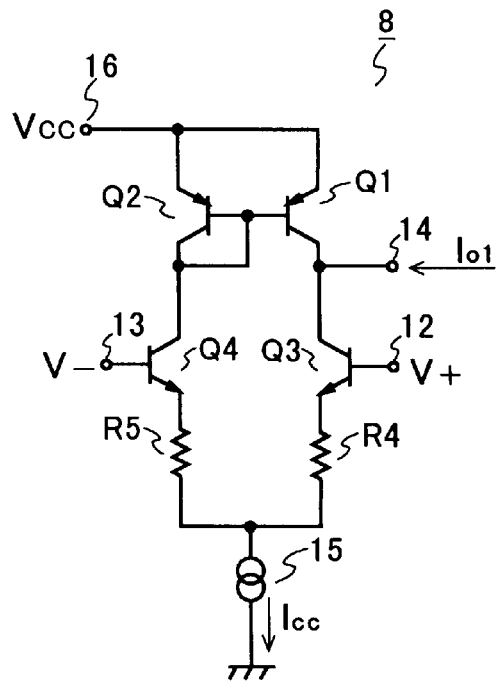
FIG. 3 is a diagram showing the configuration of the transconductance differential amplifier provided in the current amplifier of FIG. 2.

The current amplifiers 1 and 2 provided in the light amplifier of FIG. 1 are configured as shown in FIGS. 2 and 3, and therefore their gain can be varied easily by appropriately setting the resistances of the resistors included in them. Thus, the gain of each of the current amplifiers 1 and 2 provided in the light amplifier of FIG. 1 can be set independently, and therefore the addition or subtraction operation can be performed with different factors set for the individual currents output from a plurality of light-receiving elements.

Incidentally, also in the conventional light amplifier shown in FIG. 6, by setting the gain of each of the amplifiers 26 and 27 independently, it is possible to perform an addition or subtraction operation with different factors set for the individual currents output from a plurality of light-receiving elements. Here, however, setting the factors in that way affects the loop gain of the non-inverting amplifier 28. As a result, if there are large differences among the factors for the individual currents output from a plurality of light-receiving elements, the highest factor among them affects the non-inverting amplifier 28 in such a way as to degrade its characteristics, and this makes it inevitable to set a limit to the factors that can be set.

By contrast, in the light amplifier of FIG. 1, each current amplifier has a sufficiently high output impedance to prevent the factor set for one current amplifier from affecting another current amplifier or the transimpedance amplifier 3. Thus, in the light amplifier of FIG. 1, there is no need to set a limit to the factors that can be set, and this increases the flexibility with which factors can be set for the individual currents output from a plurality of light-receiving elements.

Next, the input impedance of the transimpedance amplifier 3 will be described. As described above, the current amplifiers 1 and 2 provided in the light amplifier of FIG. 1 have high input impedances. This lowers the frequency of the pole that appears in the time constant calculated as the input impedance at the node n1 multiplied by the parasitic capacitance ascribable to the wiring connected to the node n1 and the like.

However, since signal transmission at the node n1 is achieved by a current, the current signal obtained by adding together the output currents of the current amplifiers 1 and 2 has only to be fed, as a current signal, to the input side of the transimpedance amplifier 3, and therefore, as long as no variations appear in the voltage at the node n1 meanwhile, the appearance of the pole does not cause degradation of the band width. That is, by making the input impedance of the transimpedance amplifier 3 as low as possible, it is possible to lower the input impedance at the node n1, and thereby make the frequency of variations in the voltage at the node n1 lower than the frequency of the pole to obtain a wide band width.

In a case where the transimpedance amplifier 3 is designed to have a low input impedance in this way, the voltages at the inverting and non-inverting input terminals of the transimpedance amplifier 3 are equal. Thus, the voltage at the output terminals of the current amplifiers 1 and 2 is also equal to the voltage at the non-inverting input terminal of the transimpedance amplifier 3.

Here, the output circuit portion of the current amplifier is, to offer a high output impedance, so configured as to control the outflow and inflow of a current by connecting together the collector outputs of common-emitter or common-base circuits. In the configuration shown in FIG. 3, the collector outputs of common-emitter circuits are connected together. Therefore, in the transconductance differential amplifier 8 shown in FIG. 3, a high output impedance is obtained only when the transistors Q1 and Q3 are both in an active state.

Figure 4:
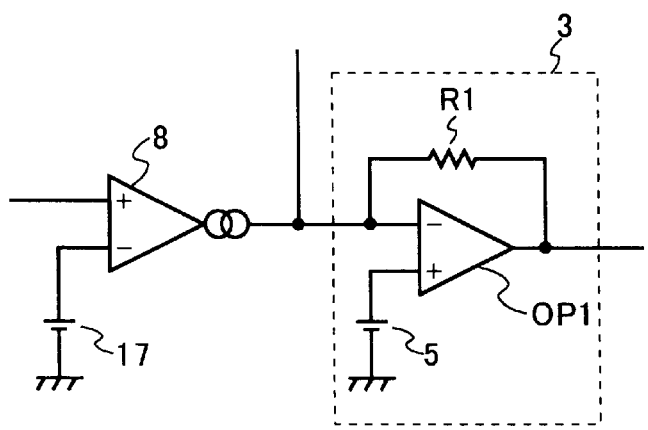
FIG. 4 is a diagram showing the configuration in which the transimpedance amplifier provided in the current amplifier of FIG. 2 is replaced with a constant voltage source.

To fulfill this condition, it is advisable, as shown in FIG. 4, to replace the transimpedance amplifier 7 provided in the current amplifier of FIG. 2 with a constant voltage source 17 and make the output voltage of the constant voltage source 17 equal to the output voltage of the constant voltage source 5 within the transimpedance amplifier 3.

When the output voltages of the constant voltage sources 17 and 5 are made equal, the collector voltage of the transistor Q3 is always equal to the base voltage of the transistor Q4. Then, simply by keeping the base voltage of the transistor Q3 lower than the base voltage of the transistor Q4, it is possible to keep both the transistors Q1 and Q3 in an active state and thereby maintain a high output impedance. Thus, by appropriately setting the output voltages of the constant voltage sources 5 and 17 according to the range of the output current signal of the current amplifier, and then setting the base voltage of the transistor Q3 lower than the base voltage of the transistor Q4, it is possible to always keep the output impedance of the current amplifier high. This makes it possible to increase the gain of the light amplifier without reducing the loop gain of the transimpedance amplifier 3, and thus to realize a light amplifier that offers a high gain and a wide band width.

The constant voltage sources 5 and 17 do not necessarily have to be direct-current voltage sources, but may be alternating-current voltage sources that output mutually synchronous alternating-current voltages. Instead of replacing the transimpedance amplifier 7 with the constant voltage source 17, the transimpedance amplifier 7 may be operated as a constant voltage source that outputs the same voltage as the constant voltage source 5.

Figure 5:
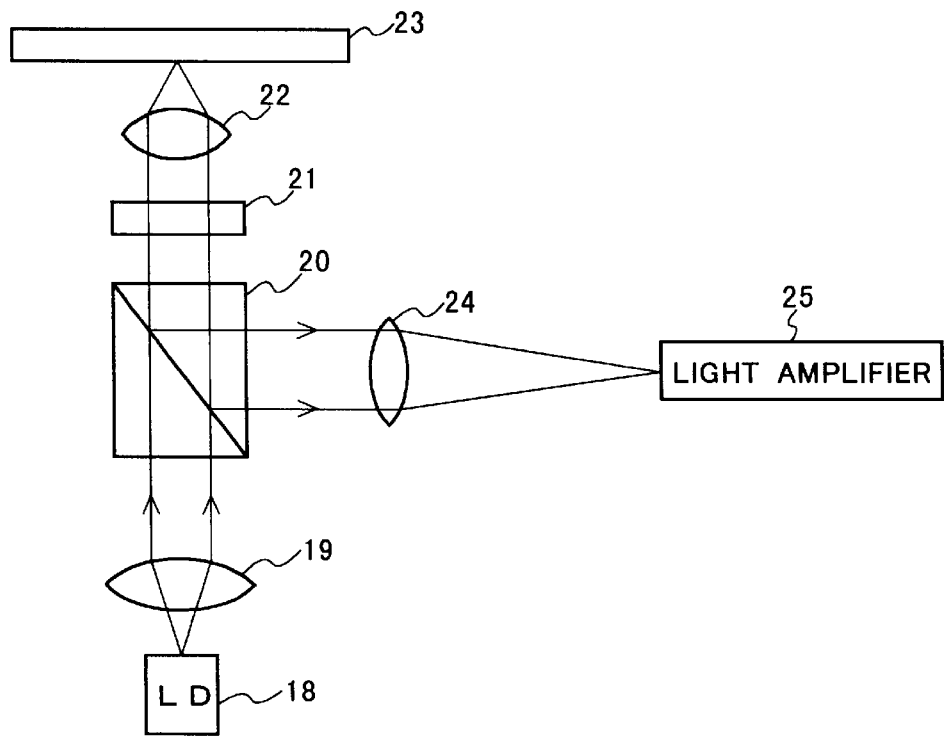
FIG. 5 is a diagram showing the configuration of the optical pickup device.

Next, an optical pickup device according to the invention will be described. The optical pickup device according to the invention is provided with the light amplifier according to the present invention shown in FIG. 1. FIG. 5 shows the construction of the optical system of the optical pickup device according to the invention.

The laser beam emitted from a semiconductor laser 18 is formed into a parallel beam by a collimator lens 19, is then transmitted through a beam splitter 20, is then passed through a quarter-wave plate 21, and is then condensed by an objective lens 22. The condensed light beam is reflected from an optical disc 23, is then formed into a parallel beam by the objective lens 22, is then passed through the quarter-wave plate 21, is then reflected from the beam splitter 20, and is then condensed by a condenser lens 24 so as to reach a light amplifier 25. The light amplifier 25 adds together the output currents of the photodiodes D1 and D2 and outputs a voltage $V_O$ according to their sum.

The light amplifier 25 is a high-gain, wide-band-width amplifier. However, the light amplifier 25, since it performs signal processing by using current signals, is affected by the Early effect of transistors, leak currents through various circuit elements, and the like and is thus inferior in level transmission accuracy to signal processing using voltage signals. Specifically, the light amplifier of FIG. 1 suffers from larger variations in the output voltage when no signal is present than the conventional light amplifier shown in FIG. 6.

Incidentally, in the reproduction of a data signal in an optical pickup device, whereas no high accuracy is required in terms of direct-current levels, high-speed and high-gain amplification is required. On the other hand, in the processing of a servo signal for focusing and tracking in an optical pickup device, whereas the frequency band width required is far lower than that required for the reproduction of a data signal (about 20 kHz for the reproduction of audio from a CD), high accuracy is required in the amplification factor and in the offset level when no signal is present in order to produce the servo signal from very small differences between signals.

For these reasons, in the optical pickup device according to the invention, not only is a data signal produced on the basis of the output voltage $V_O$ of the light amplifier 25, but also a conventional light amplifier (not shown) is provided so that a servo signal is produced on the basis of the output voltage of the conventional light amplifier. It is advisable to share the photodiodes, which serve as light-receiving elements, between the light amplifier 25 and the conventional light amplifier for producing the servo signal.

In this way, separately providing a light amplifier suitable for producing a data signal and a light amplifier suitable for producing a servo signal eliminates the need to pursue a wide band width and high accuracy, which are conflicting objectives, within a single amplifier. This makes it easier to realize a high-performance optical pickup device.

The embodiments described above deal only with a light amplifier provided with two photodiodes. However, the present invention can be applied to any other configuration; for example, it can be applied to a configuration in which four photodiodes are provided as light-receiving elements, and accordingly four current amplifiers are provided to separately amplify the individual output currents from those photodiodes, with the output terminals of those current amplifiers connected together and to the input side of a transimpedance amplifier.

What is claimed is:

1. A light amplifier comprising:
   a plurality of light amplifier circuits; and
   a first transimpedance amplifier,
   wherein the light amplifier circuits each have a light-receiving element that outputs a current according to intensity of light received and a current amplifier that outputs a current by amplifying the output current of the light-receiving element, and
   wherein an input terminal of the first transimpedance amplifier is connected to a node at which output terminals of the individual current amplifiers are connected together.

2. A light amplifier as claimed in claim 1,
   wherein all the current amplifiers each comprise:
   a second transimpedance amplifier to which the output current of the corresponding light-receiving element is fed;
   a third transimpedance amplifier that has a same configuration as the second transimpedance amplifier and that receives at an input terminal thereof a voltage equal to a bias voltage applied to the light-receiving element; and
   a transconductance differential amplifier to which output voltages of the second and third transimpedance amplifiers are fed and that outputs a current according to a value obtained by subtracting the output voltage of the third transimpedance amplifier from the output voltage of the second transimpedance amplifier.

3. A light amplifier as claimed in claim 2,
   wherein at least one of the current amplifiers is replaced with a current amplifier comprising:
   a second transimpedance amplifier to which the output current of the corresponding light-receiving element is fed;
   a third transimpedance amplifier that has a same configuration as the second transimpedance amplifier and that receives at an input terminal thereof a voltage equal to a bias voltage applied to the light-receiving element; and
   a transconductance differential amplifier to which output voltages of the second and third transimpedance amplifiers are fed and that outputs a current according to a value obtained by subtracting the output voltage of the second transimpedance amplifier from the output voltage of the third transimpedance amplifier.

4. A light amplifier as claimed in claim 2,
   wherein gain setting resistors provided within the second and third transimpedance amplifiers and gain setting resistors provided within the transconductance differential amplifiers are formed in a same process.

5. A light amplifier as claimed in claim 3,
   wherein gain setting resistors provided within the second and third transimpedance amplifiers and gain setting resistors provided within the transconductance differential amplifiers are formed in a same process.

6. A light amplifier as claimed in claim 2,
   wherein, in place of the third transimpedance amplifiers, constant voltage sources are provided of which output voltages are equal to corresponding voltages on an input side of the first transimpedance amplifier.

7. A light amplifier as claimed in claim 1,
   wherein part or all of the current amplifiers have different gains.

8. A light amplifier as claimed in claim 1,
   wherein, by making an input impedance of the first transimpedance amplifier low, variations in a voltage at the node is reduced, and a frequency of the variations in this voltage is made lower than a cut-off frequency of a voltage signal which is determined by a time constant calculated as an input impedance at the node multiplied by a parasitic capacitance there.

9. An optical pickup device comprising:
   a plurality of light amplifier circuits;
   a first transimpedance amplifier; and
   a signal processing circuit,
   wherein the light amplifier circuits each have a light-receiving element that outputs a current according to intensity of light received and a current amplifier that outputs a current by amplifying the output current of the light-receiving element, wherein an input terminal of the first transimpedance amplifier is connected to a node at which output terminals of the individual current amplifiers are connected together, and wherein the signal processing circuit receives output signals of the light-receiving elements and produces a servo signal.

10. An optical pickup device as claimed in claim 9, wherein all the current amplifiers each comprise:
- a second transimpedance amplifier to which the output current of the corresponding light-receiving element is fed;
- a third transimpedance amplifier that has a same configuration as the second transimpedance amplifier and that receives at an input terminal thereof a voltage equal to a bias voltage applied to the light-receiving element; and
- a transconductance differential amplifier to which output voltages of the second and third transimpedance amplifiers are fed and that outputs a current according to a value obtained by subtracting the output voltage of the third transimpedance amplifier from the output voltage of the second transimpedance amplifier.

11. An optical pickup device as claimed in claim 10, wherein at least one of the current amplifiers is replaced with a current amplifier comprising:
- a second transimpedance amplifier to which the output current of the corresponding light-receiving element is fed;
- a third transimpedance amplifier that has a same configuration as the second transimpedance amplifier and that receives at an input terminal thereof a voltage equal to a bias voltage applied to the light-receiving element; and
- a transconductance differential amplifier to which output voltages of the second and third transimpedance amplifiers are fed and that outputs a current according to a value obtained by subtracting the output voltage of the second transimpedance amplifier from the output voltage of the third transimpedance amplifier.

12. An optical pickup device as claimed in claim 10, wherein gain setting resistors provided within the second and third transimpedance amplifiers and gain setting resistors provided within the transconductance differential amplifiers are formed in a same process.

13. An optical pickup device as claimed in claim 11, wherein gain setting resistors provided within the second and third transimpedance amplifiers and gain setting resistors provided within the transconductance differential amplifiers are formed in a same process.

14. An optical pickup device as claimed in claim 10, wherein, in place of the third transimpedance amplifiers, constant voltage sources are provided of which output voltages are equal to corresponding voltages on an input side of the first transimpedance amplifier.

15. An optical pickup device as claimed in claim 9, wherein part or all of the current amplifiers have different gains.

16. An optical pickup device as claimed in claim 9, wherein, by making an input impedance of the first transimpedance amplifier low, variations in a voltage at the node is reduced, and a frequency of the variations in this voltage is made lower than a cut-off frequency of a voltage signal which is determined by a time constant calculated as an input impedance at the node multiplied by a parasitic capacitance there.

* * * * *